(12) United States Patent
Kosakai

(10) Patent No.: US 6,768,079 B2
(45) Date of Patent: Jul. 27, 2004

(54) SUSCEPTOR WITH BUILT-IN PLASMA GENERATION ELECTRODE AND MANUFACTURING METHOD THEREFOR

(75) Inventor: Mamoru Kosakai, Narashino (JP)

(73) Assignee: Sumitomo Osaka Cement Co. Ltd. (JP)

( * ) Notice: Subject to any disclaimer, the term of this patent is extended or adjusted under 35 U.S.C. 154(b) by 77 days.

(21) Appl. No.: 10/283,412

(22) Filed: Oct. 29, 2002

(65) Prior Publication Data

US 2003/0085206 A1 May 8, 2003

(30) Foreign Application Priority Data

Nov. 8, 2001 (JP) ..................................... P2001-343741

(51) Int. Cl.[7] .............................................. B23K 9/00
(52) U.S. Cl. ............................ 219/121.52; 219/121.58; 219/121.41; 156/345.35; 156/345.47; 204/298.21; 204/298.36; 392/416; 392/418
(58) Field of Search ................................. 219/390, 405, 219/411, 121.58, 121.59, 121.43, 121.52, 121.41, 121.4, 444.1; 392/416, 418; 118/724, 725, 50.1; 156/345.35, 345.47, 345.52; 204/298.21, 298.36, 298.38

(56) References Cited

U.S. PATENT DOCUMENTS 4,304,980 A * 12/1981 Fridlyand et al. ...... 219/121.52
5,460,684 A * 10/1995 Saeki et al. ............ 156/345.51
6,126,752 A * 10/2000 Fujii et al. .................. 118/620
6,286,451 B1 * 9/2001 Ishikawa et al. .......... 118/723 I

FOREIGN PATENT DOCUMENTS

| JP | 06-151332 | 5/1994 |
| JP | 08-236599 | 9/1996 |
| JP | 2000-277592 | 6/2000 |
| JP | 2001-085505 | 3/2001 |
| JP | 2001-287982 | 10/2001 |

* cited by examiner

Primary Examiner—Shawntina Fuqua
(74) Attorney, Agent, or Firm—Ostrolenk, Faber, Gerb & Soffen, LLP (57) ABSTRACT

The invention provides a susceptor with a built-in plasma generation electrode that can make the throughput by a range of plasma processing of a plate specimen uniform, and that has excellent plasma resistance, thermal conductivity and durability, and a manufacturing method that can obtain this susceptor with a built-in plasma generation electrode easily and economically.

The susceptor with a built-in plasma generation electrode 11 of the present invention comprises: a mounting plate 12 formed from a ceramic, whose surface is a mounting surface 12a for mounting a plate specimen; a support plate 14 which supports this mounting plate 12 and in which a fixing hole 13 is formed; a plasma generation electrode 15 provided between the mounting plate 12 and the support plate 14; and a power supply terminal 16 provided in the fixing hole 13, wherein a region 21 in the vicinity of the connection of the plasma generation electrode 15 to the power supply terminal 16 has a lower resistance than the other region 22 of the plasma generation electrode 15.

16 Claims, 6 Drawing Sheets

SUSCEPTOR WITH BUILT-IN PLASMA GENERATION ELECTRODE AND MANUFACTURING METHOD THEREFOR

BACKGROUND OF THE INVENTION

1. Field of the Invention

The present invention relates to a susceptor with a built-in plasma generation electrode and a manufacturing method therefor. In particular, it relates to a susceptor with a built-in plasma generation electrode that has excellent corrosion resistance and plasma resistance, that can enable uniform etching of plate specimens, deposition of film and so forth, and that has excellent durability, and a manufacturing method for a susceptor with a built-in plasma generation electrode that enables a susceptor with a built-in plasma generation electrode to be manufactured economically and with a high yield.

2. Description of the Related Art

In recent years, in plasma etching apparatus, plasma CVD apparatus and the like used in manufacturing processes of semiconductor devices such as ICs, LSIs and VLSIs, in order to perform film deposition uniformly on each wafer by plasma etching or plasma CVD, these wafers (plate specimens) are mounted onto a specimen support (pedestal) called a susceptor, and prescribed processing is carried out.

Because this susceptor must withstand use within plasma and use at high temperatures, the susceptor must have excellent plasma resistance and high heat conductivity.

For such a susceptor, a susceptor formed from a ceramic sintered body having excellent plasma-resistance and thermal conductivity is used.

Figure 7:
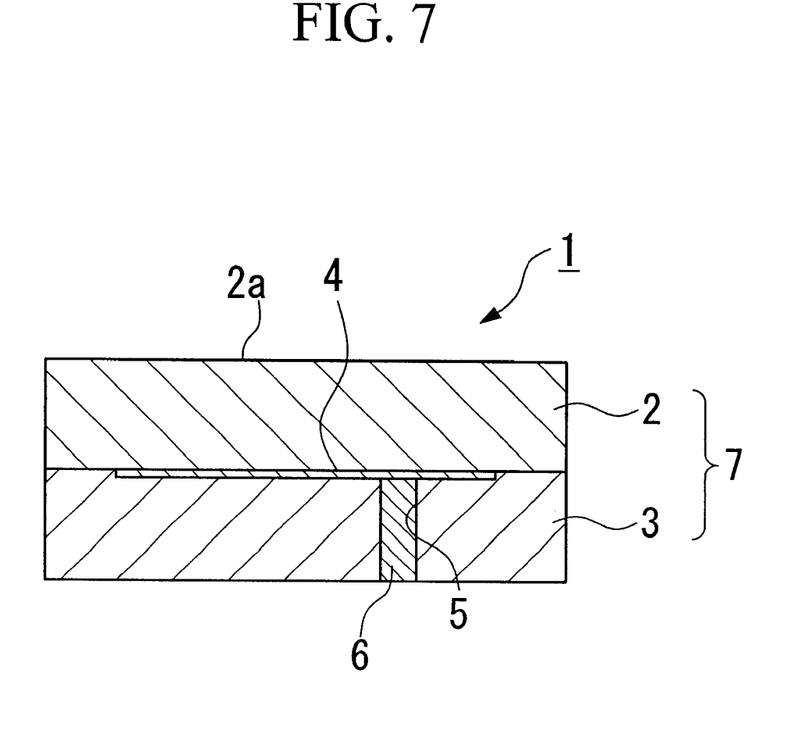
FIG. 7 is a longitudinal sectional view showing a conventional susceptor with a built-in plasma generation electrode.

Heretofore, as an example of a susceptor formed from such a ceramic sintered body, a susceptor with a built-in plasma generation electrode as shown in FIG. 7 is known.

This susceptor with a built-in plasma generation electrode 1 comprises: a mounting plate 2, the upper surface of which serves as a mounting surface 2a on which a plate specimen such as a wafer or the like is mounted; a support plate 3 which is unified with this mounting plate 2 to support the mounting plate 2; a plasma generation electrode 4 which is formed between the mounting plate 2 and the support plate 3; and a power supply terminal 6 which is installed in a fixing hole 5 passing through the support plate 3 and makes contact with the plasma generation electrode 4, and which also supplies external high frequency current to the plasma generation electrode 4.

The above-described mounting plate 2 is flat and formed from an insulated ceramic sintered body, the support plate 3 is flat and formed from a insulated ceramic sintered body, and a susceptor substrate 7 is created by the mounting plate 2 and the support plate 3.

Furthermore, the plasma generation electrode 4 comprises conductive layers whose main constituents are metals with high melting points such as tungsten (W), molybdenum (Mo), tantalum (Ta), niobium (Nb), and the like, and the value of whose resistance is uniform over these conductive layers.

The power supply terminal 6 is a rod whose main constituents are high melting point metals such as tungsten (W), molybdenum (Mo), tantalum (Ta), niobium (Nb) and the like.

In order to manufacture this susceptor with a built-in plasma generation electrode 1, firstly the fixing hole 5 passing perpendicularly through the support plate 3 is formed at a predetermined location, and the power supply terminal 6 is fixed into this fixing hole 5.

Next, this support plate 3 is coated with a conductive coating material 7 containing a high melting point metal powder so as to make contact with the power supply terminal 6, and then dried. After this, the support plate 3 and the mounting plate 2 are superposed via the coated surface of this conductive coating material 7 and are unified by heat treatment under pressure, and also a plasma generation electrode 4 is formed between the support plate 3 and the mounting plate 2 by applying heat treatment to the conductive coating material 7.

As above, a susceptor with a built-in plasma generation electrode 1 can be obtained in which the plasma generation electrode 4 and the power supply terminal 6 are joined reliably and firmly.

However, the susceptor 1 as described above has a problem in that, because the surface uniformity of a plate specimen of a wafer or the like is not always even after a process that uses plasma, such as deposition, etching and the like of the plate specimen, non-uniformity in the characteristics of the obtained semiconductor device is significant.

Especially as wafer diameters have increased in recent years, since non-uniformities of wafer surface characteristics must be minimized as much as possible, a susceptor, including a susceptor with a built-in plasma generation electrode that further enhances the uniformity of the surface after processing in a range of plasma processes has been much sought after.

Furthermore, cracking occurs easily in the vicinity of the connection of the plasma generation electrode 4 and the power supply terminal 6, so that there is a problem in that durability of a susceptor with a built-in plasma generation electrode is not sufficient.

SUMMARY OF THE INVENTION

The present invention aims to solve the above-described problems with an object of providing a susceptor with a built-in plasma generation electrode that can make the throughput in a range of plasma processes on a mounted plate specimen more uniform, and which also has excellent plasma-resistance, thermal conductivity and durability, and a manufacturing method that allows a susceptor with a built-in plasma generation electrode to be produced easily and economically.

As a result of intensive research, the inventors discovered that in a conventional susceptor with a built-in plasma generation electrode, since the region in the vicinity of the connection of the plasma generation electrode and the power supply terminal becomes a high current density region during plasma generation, abnormal heat generation occurs easily in the vicinity of this connection, and consequently the throughput in a range of plasma processes on a mounted plate specimen becomes non-uniform. Moreover, they discovered that since cracking occurs easily in the vicinity of this connection, the durability of a susceptor with a built-in plasma generation electrode is not sufficient. Therefore, the inventors realized that if a part being a high current density region in a plasma generation electrode, that is the region in the vicinity of the connection of the plasma generation electrode and the power supply terminal, is made to be low resistance, then the above problem can be solved effectively, thereby arriving at the present invention.

In other words, a susceptor with a built-in plasma generation electrode of the present invention comprises: a susceptor substrate formed from a ceramic, one principal plane of which is a mounting surface on which a plate specimen is mounted; a plasma generation electrode built into this susceptor substrate; and a power supply terminal which is located so as to pass through the susceptor substrate and connected to the plasma generation electrode, wherein a region in the vicinity of the connection of the plasma generation electrode to the power supply terminal has a lower resistance than other regions of the plasma generation electrode.

In this susceptor with a built-in plasma generation electrode, since the region in the vicinity of the connection of the plasma generation electrode to the power supply terminal has a lower resistance than the other regions, abnormal heat generation is suppressed in the region (low resistance region) in the vicinity of the connection of the plasma generation electrode to the power supply terminal, so that the heat of the susceptor substrate is made uniform. This improves the heat uniformity of the mounting surface of the susceptor substrate, resulting in an improvement in heat uniformity of a plate specimen mounted onto the mounting surface, and the throughput by plasma processing of the plate specimen is made uniform. Furthermore, as a result of the improvement in heat uniformity of the mounting surface of the susceptor substrate, durability is improved significantly.

Preferably, the susceptor substrate comprises a mounting plate formed from a ceramic, one principal plane of which is a mounting surface on which a plate specimen is mounted, and a support plate formed from a ceramic, which is joined and unified with the mounting plate.

With such a construction, it is possible to position the plasma generation electrode at a desired location on the susceptor substrate. Furthermore, since it is possible to connect the plasma generation electrode and the power supply terminal reliably and firmly, reliability of electrical contact is improved.

Preferably, an insulating layer that has at least the same principal ingredient as the support plate and the mounting plate, is formed in the regions on the support plate excluding the plasma generation electrode. With such a construction, insulation of the plasma generation electrode is enhanced.

Preferably, the ceramic is an aluminum oxide based ceramic or an aluminum nitride based ceramic.

The low resistance region of the plasma generation electrode is preferably of a multilayer structure containing a total of two or more conductive ceramic layers and/or composite conductive ceramic layers.

Preferably, the multilayer structure is a three layer structure in which the composite conductive ceramic layer, the conductive ceramic layer or high melting point metal layer, and the composite conductive ceramic layer are stacked in sequence.

It is preferable that the composite conductive ceramic layer is of a type selected from an aluminum oxide and tantalum carbide composite conductive ceramic, an aluminum oxide and molybdenum carbide composite conductive ceramic, and an aluminum oxide and tungsten composite conductive ceramic, that the conductive ceramic layer is a tantalum carbide conductive ceramic or molybdenum carbide conductive ceramic, and that the high melting point metal layer is tantalum or tungsten.

Furthermore, the composite conductive ceramic layer may be an aluminum nitride and tungsten composite conductive ceramic or an aluminum nitride and molybdenum composite conductive ceramic, and the high melting metal layer may be tungsten or molybdenum.

A manufacturing method for a susceptor with a built-in plasma generation electrode of the present invention comprises the steps of: manufacturing a mounting plate on which a plate specimen is mounted and a support plate that supports the mounting plate using ceramics; then forming an open hole in the support plate and inserting and fixing a power supply terminal into this open hole; then coating with a first electrode coating material containing conductive powder on one principal plane of the support plate so as to make contact with the power supply terminal to form a first plasma generation electrode forming layer; then coating with a second electrode coating material containing conductive powder with a higher resistance than the first electrode coating material in the regions on the principal plane of the support plate excluding the first plasma generation electrode forming layer, to form a second plasma generation electrode forming layer with a higher resistance than the first plasma generation electrode forming layer; then superposing the mounting plate onto the support plate via the first and second plasma generation electrode forming layers, heat treating under pressure to form a plasma generation electrode having a low resistance region and a high resistance region between the support plate and the mounting plate, and joining and unifying them.

In this manufacturing method for a susceptor with a built-in plasma generation electrode, by forming a first plasma generation electrode forming layer, being a low resistance region, and a second plasma generation electrode forming layer, being a higher resistance region than the first plasma generation electrode forming layer, on the interface between the mounting plate and the support plate, formed from ceramics, and by heat treating the support plate and the mounting plate together with the first and second plasma generation electrode forming layers under pressure, abnormal heat generation in the region in the vicinity of the connection of the plasma generation electrode to the power supply terminal is suppressed, so that heat uniformity of the mounting surface of the susceptor substrate is improved, and the throughput by plasma processing of a plate specimen that is mounted onto this mounting surface is made uniform. Moreover, it is possible to manufacture a susceptor with a built-in plasma generation electrode, whose durability is improved significantly, economically and with a high yield.

Another manufacturing method for a susceptor with a built-in plasma generation electrode of the present invention comprises the steps of: manufacturing a mounting plate green body on which a plate specimen is mounted and a support plate green body that supports the mounting plate using a slurry containing ceramic powder; then forming an open hole in the support plate green body, and packing power supply forming material containing conductive powder, or inserting a power supply terminal, into this open hole; then coating with a first electrode coating material containing conductive powder on one principal plane of the support plate green body so as to make contact with the power supply forming material or the power supply terminal to form a first plasma generation electrode forming layer; then coating with a second electrode coating material containing conductive powder with a higher resistance than the first electrode coating material in the regions on the principal plane of the support plate green body excluding the first plasma generation electrode forming layer, to form a second plasma generation electrode forming layer with a higher resistance than the first plasma generation electrode forming layer; then superposing the mounting plate green body onto the support plate green body via the first and second plasma generation electrode forming layers, and heat treating under pressure to form a plasma generation electrode having a low resistance region and a high resistance region between the support plate and the mounting plate, formed from ceramics, and joining and unifying them.

In this manufacturing method for a susceptor with a built-in plasma generation electrode, by forming a first plasma generation electrode forming layer, being a low resistance region, and a second plasma generation electrode forming layer, being a higher resistance region than the first plasma generation electrode forming layer, on the interface between the mounting plate green body and the support plate green body, and by heat treating the support plate green body and the mounting plate green body together with the first and second plasma generation electrode forming layers under pressure, abnormal heat generation in the region in the vicinity of the connection of the plasma generation electrode to the power supply terminal is suppressed, so that heat uniformity of the mounting surface of the susceptor substrate is improved, and the throughput by plasma processing of a plate specimen that is mounted onto this mounting surface is made uniform. Moreover, it is possible to manufacture a susceptor with a built-in plasma generation electrode whose durability is improved significantly, by one heat treatment, economically and with a high yield.

In both of the manufacturing methods described above, a method is desirable wherein by forming an insulation material layer containing ceramic powder, which has at least the same principal ingredient as the support plate or the support plate green body, in the regions on one principal plane of the support plate or the support plate green body excluding the first and second plasma generation electrode forming layers, and then heat treating under pressure, the insulation material layer is made to be an insulating layer.

By employing such a method, it is possible to manufacture a susceptor with a built-in plasma generation electrode with the insulation of the plasma generation electrode further enhanced.

Furthermore, the ceramic is preferably an aluminum oxide based ceramic or an aluminum nitride based ceramic.

Moreover, it is preferable that the first plasma generation electrode forming layer is made a three layer structure by forming a first layer using a composite conductive ceramic layer forming coating agent, forming a second layer using a conductive ceramic layer forming coating agent or a high melting point metal layer forming coating agent, and forming a third layer using a composite conductive ceramic layer forming coating agent.

Furthermore, it is preferable that the composite conductive ceramic layer forming coating agent contains one powder selected from; an aluminum oxide and tantalum carbide composite conductive ceramic powder, an aluminum oxide and molybdenum carbide composite conductive ceramic powder, and an aluminum oxide and tungsten composite conductive ceramic powder, the conductive ceramic layer forming coating agent contains a tantalum carbide conductive ceramic powder or a molybdenum carbide conductive ceramic powder, and the high melting point metal layer forming coating agent contains tantalum powder or tungsten powder.

Moreover, the composite conductive ceramic layer forming coating agent may contain an aluminum nitride and tungsten composite conductive ceramic powder, or an aluminum nitride and molybdenum composite conductive ceramic powder, and the high melting point metal layer forming coating agent may contain tungsten powder or molybdenum powder.

DETAILED DESCRIPTION OF THE INVENTION

Embodiments of a susceptor with a built-in plasma generation electrode and manufacturing methods therefor according to the present invention are described below.

Here, in order to better understand the gist of the invention, the embodiments are described specifically, but the present invention is not limited to these unless specified.

First Embodiment

Figure 1:
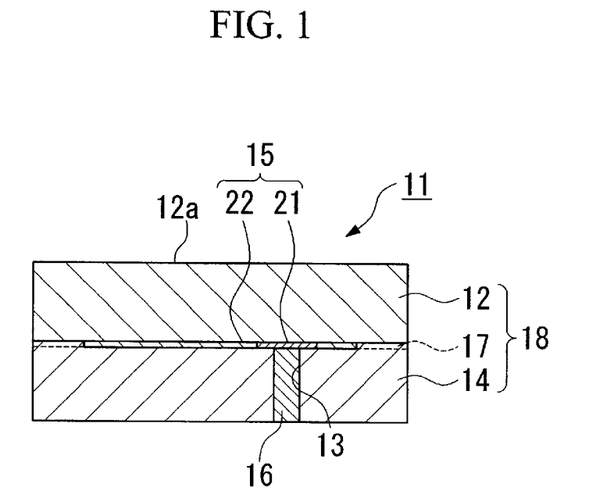
FIG. 1 is a longitudinal sectional view showing a susceptor with a built-in plasma generation electrode of a first embodiment of the present invention.
Figure 2:
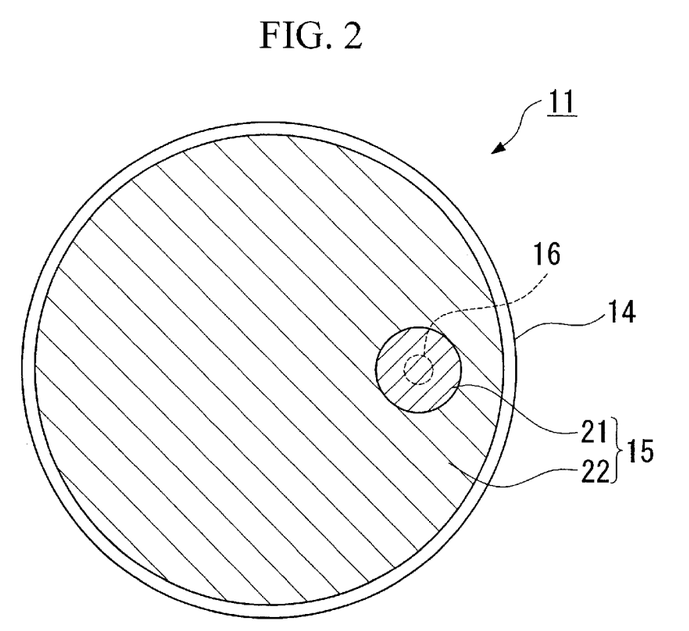
FIG. 2 is a cross-sectional view showing the susceptor with a built-in plasma generation electrode of the first embodiment of the present invention.
Figure 3:
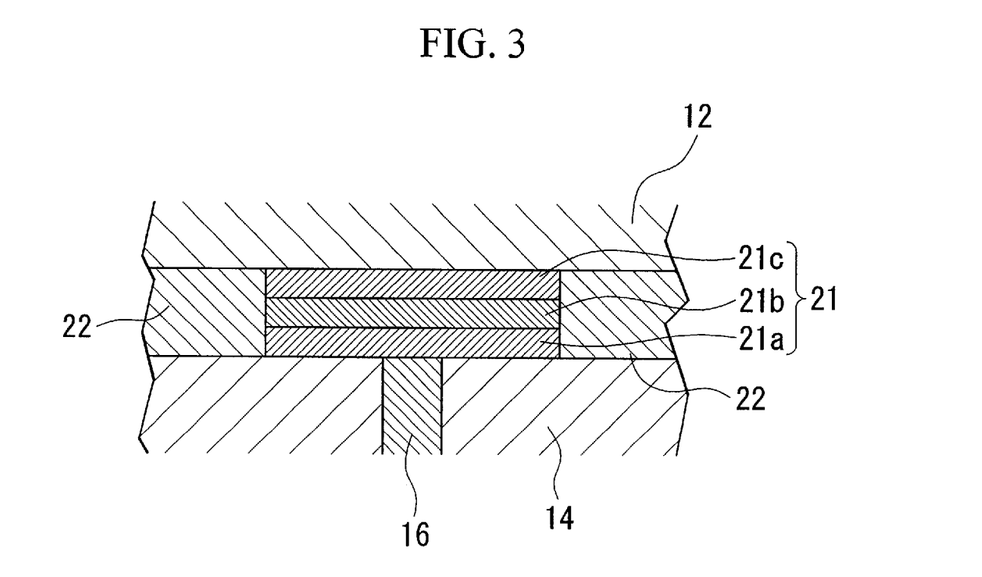
FIG. 3 is a longitudinal sectional view showing the main parts of the susceptor with a built-in plasma generation electrode of the first embodiment of the present invention.

FIG. 1 is a longitudinal sectional view showing a susceptor with a built-in plasma generation electrode of a first embodiment of the present invention, FIG. 2 is a cross-sectional view of the same, and FIG. 3 is a longitudinal sectional view showing the main parts of this susceptor with a built-in plasma generation electrode. This susceptor with a built-in plasma generation electrode 11 comprises: a mounting plate 12, the upper surface (one principal plane) of which serves as a mounting surface 12a on which a plate specimen such as a wafer or the like is mounted; a support plate 14 which is unified with this mounting plate 12, and in which a fixing hole (open hole) 13 is formed that passes through in the thickness direction; a plasma generation electrode 15 which is formed between the mounting plate 12 and the support plate 14; and a power supply terminal 16 which is installed in the fixing hole 13 of the support plate 14 and joined to the plasma generation electrode 15, and which also supplies external high frequency current to the plasma generation electrode 15, wherein the mounting surface 12a is polished to obtain a flatness of 10 $\mu$m or less.

The mounting plate 12 and the support plate 14 are formed from a ceramic which is of the same composition or has the same principal ingredient, have the same shape for their coincident surfaces, and are joined and unified by an insulating layer 17, formed from an insulating material that has the same composition or has the same principal ingredient as the material constituting the mounting plate 12 and the support plate 14, so that the mounting plate 12 and the support plate 14 form a susceptor substrate 1.

For the ceramic forming the mounting plate 12 and the support plate 14, an alumina (aluminum oxide) based ceramic having excellent plasma-resistance or corrosion resistance, or an aluminum nitride based ceramic having excellent plasma-resistance or thermal conductivity, are used preferably. Here, an alumina based ceramic refers to a ceramic that contains 50 wt % or more of alumina, and contains less than 50 wt % of ingredients other than alumina, for example silicon carbide (SiC) or silica ($SiO_2$), and preferably 20 wt % or less. Similarly, an aluminum nitride based ceramic refers to a ceramic that contains 50 wt % or more of aluminum nitride, and less than 50 wt % of ingredients other than aluminum nitride, for example silicon carbide (SiC), yttrium oxide ($Y_2O_3$) or magnesium oxide (MgO).

The above-described insulating layer 17 is provided in order to join the interfaces of the mounting plate 12 and the support plate 14, in other words the regions excluding the part of the plasma generation electrode 15, and is calcinated under pressure from an insulating material powder that has the same composition as or has the same principal ingredient as the material constituting the mounting plate 22 and the support plate 23. Here, "a material that has the same principal ingredient" refers to a material that contains 50 wt % or less of materials other than the ceramic material constituting the mounting plate 12 and the support plate 14, and preferably 20 wt % or less.

The plasma generation electrode 15 conducts high frequency current in order to generate plasma, and is used as an internal electrode to perform a range of plasma processing by this plasma. The shape and size thereof may be adjusted appropriately according to the plasma to be generated.

A high current density region in the vicinity of the connection of this plasma generation electrode 15 to the power supply terminal 16, for example a region that has 3 times or more the current density than the average current density of all regions of the plasma generation electrode 15, more specifically a region corresponding to five to a hundred times the end face area of the power supply terminal 16, with the central axis of the upper end of the power supply terminal 16 as its center, is made to be of a lower resistance than the other regions of the plasma generation electrode 15.

According to the above, the electrode plane of this plasma generation electrode 15 comprises two resistance regions, these being a low resistance region 21 in the vicinity of the connection to the power supply terminal 16, and a high resistance region 22 that has higher resistance than the low resistance region 21 and is formed in the regions excluding this low resistance region 21.

This low resistance region 21 is of a multilayer structure containing a total of two or more of a conductive ceramic layer and/or a composite conductive ceramic layer.

Especially desirable, as shown in FIG. 3, is a three layer structure in which a first electrode layer 21a formed from a composite conductive ceramic layer, a second electrode layer 21b formed from a conductive ceramic layer or a high melting point metal layer, and a third electrode layer 21c formed from a composite conductive ceramic layer are stacked sequentially on the support plate 14.

Preferably, the above described composite conductive ceramic layer is of a type selected from an alumina and tantalum carbide composite conductive ceramic, an alumina and molybdenum carbide composite conductive ceramic, and an alumina and tungsten composite conductive ceramic. Furthermore, the conductive ceramic layer is preferably a tantalum carbide conductive ceramic or a molybdenum carbide conductive ceramic.

Moreover, the composite conductive ceramic layer may be an aluminum nitride and tungsten composite conductive ceramic or an aluminum nitride and molybdenum composite conductive ceramic, and the high melting point metal layer may be tungsten or molybdenum.

The power supply terminal 16 is provided to supply a high frequency current to the plasma generation electrode 15, and the number, shape, size and the like thereof are determined based on the shape of the plasma generation electrode 15.

This power supply terminal 16 is formed from a conductive ceramic formed by calcinating under pressure conductive ceramic powder, for example an alumina (aluminum oxide) and tungsten composite conductive ceramic powder, an alumina and tantalum carbide composite conductive ceramic powder, an alumina and molybdenum carbide composite conductive ceramic powder, an aluminum nitride and tungsten composite conductive ceramic powder, an aluminum nitride and molybdenum composite conductive ceramic powder, an aluminum nitride and tantalum carbide composite conductive ceramic powder or the like, or from a high melting point metal such as tungsten, molybdenum or the like.

Here is a further detailed description of the low resistance region 21 of the plasma generation electrode 15 as described above.

(1) A Case where the Ceramic Constituting the Mounting Plate 12 and the Support Plate 14 is an Alumina Based Ceramic.

The low resistance region 21 of the plasma generation electrode 15 is ideally any one of the following three layer structures 1 through 4.

1. A three layer structure formed from an alumina and tantalum composite conductive ceramic (first electrode layer), a tantalum carbide conductive ceramic (second electrode layer), and an alumina and tantalum carbide composite conductive ceramic (third electrode layer).
2. A three layer structure formed from an alumina and tantalum carbide composite conductive ceramic (first electrode layer), tantalum (second electrode layer), and an alumina and tantalum carbide composite conductive ceramic (third electrode layer).
3. A three layer structure formed from an alumina and molybdenum carbide composite conductive ceramic (first electrode layer), a molybdenum carbide conductive ceramic (second electrode layer), and an alumina and molybdenum carbide composite conductive ceramic (third electrode layer).
4. A three layer structure formed from an alumina and tungsten composite conductive ceramic (first electrode layer), tungsten (second electrode layer), and an alumina and tungsten composite conductive ceramic (third electrode layer).

Such a three layer structure enables low resistance to be achieved, enables the difference between the coefficients of thermal expansion of the mounting plate 12 or the support plate 14 and the plasma generation electrode 15 to be less than $2\times10^{-6}/°$ C., enables the thermal stress caused by the difference in coefficients of thermal expansion to be reduced easily, and enables an improvement in the durability of the susceptor with a built-in plasma generation electrode 11.

Furthermore, in these three layer structures, any one of the types can achieve sufficient low resistance of the second electrode layer, and the coefficients of thermal expansion of the first electrode layer and the third electrode layer further approach the coefficient of thermal expansion of the support plate 14 and the mounting plate 12 formed from an alumina based ceramic. As a result, it is possible to reduce thermal stress caused by the difference in coefficients of thermal expansion.

Here, the content of alumina in the alumina and tantalum carbide composite conductive ceramic is not limited specifically. However, for example 30 v/v % (volume %) to 70 v/v % should be used ideally.

Furthermore, the content of alumina in the alumina and molybdenum carbide composite conductive ceramic is not limited specifically. However, for example 30 v/v % to 70 v/v % should be used ideally.

Moreover, the content of alumina in the alumina and tungsten carbide composite conductive ceramic is not limited specifically. However, for example 30 v/v % to 70 v/v % should be used ideally.

Furthermore, the thicknesses of each of the first electrode layer through the third electrode layer are not limited specifically. However, a range of 5 $\mu$m to 50 $\mu$m for each layer is ideal. This is because if the thickness of each layer is outside of the above-described range, there is a possibility that sufficient low resistance and thermal stress reduction cannot be achieved.

For a conductive material for forming the high resistance region 22, being the region excluding the low resistance region 21 of the plasma generation electrode 15, a composite conductive material is used ideally, for example an alumina and tungsten composite conductive ceramic, an alumina and tantalum carbide composite conductive ceramic, an alumina and molybdenum carbide composite conductive ceramic, or the like.

The thickness of this high resistance region 22 is not limited specifically. However, it is normally within a range of 15 $\mu$m to 150 $\mu$m, and is preferably the same as the thickness of the adjacent low resistance region 21.

(2) A Case where the Ceramic Constituting the Mounting Plate 12 and the Support Plate 14 is an Aluminum Nitride Based Ceramic.

Ideally, the low resistance region 21 of the plasma generation electrode 15 is one of the following three layer structures 1 or 2.

1. A three layer structure formed from an aluminum nitride and tungsten composite conductive ceramic (first electrode layer), tungsten (second electrode layer), and an aluminum nitride and tungsten composite conductive ceramic (third electrode layer).
2. A three-layer structure formed from an aluminum nitride and molybdenum composite conductive ceramic (first electrode layer), molybdenum (second electrode layer), and an aluminum nitride and molybdenum composite conductive ceramic (third electrode layer).

Such a three layer structure enables low resistance to be achieved, enables the difference between the coefficients of thermal expansion of the mounting plate 12 or the support plate 14 and the plasma generation electrode 15 to be less than $2\times10^{-6}/^{\circ}$ C., enables the thermal stress caused by the difference in coefficients of thermal expansion to be reduced easily, and enables an improvement in the durability of the susceptor with a built-in plasma generation electrode 11.

Furthermore, in these three layer structures, any one of the types can achieve sufficient low resistance of the second electrode layer, and the coefficients of thermal expansion of the first electrode layer and the third electrode layer further approach the coefficient of thermal expansion of the support plate 14 and the mounting plate 12 formed from an aluminum nitride based ceramic. As a result, it is possible to reduce thermal stress caused by the difference in coefficients of thermal expansion.

Here, the content of aluminum nitride in the aluminum nitride and tungsten composite conductive ceramic is not limited specifically. However, for example 30 v/v % (volume %) to 70 v/v % should be used ideally.

Furthermore, the content of aluminum nitride in the aluminum nitride and molybdenum composite conductive ceramic is not limited specifically. However, for example 30 v/v % to 70 v/v % should be used ideally.

Moreover, the thicknesses of each of the first electrode layer through the third electrode layer are not limited specifically. However, a range of 5 $\mu$m to 50 $\mu$m for each layer is ideal. This is because if the thickness of each layer is outside of the above-described range, there is a possibility that sufficient low resistance and thermal stress reduction cannot be achieved.

For a conductive material for forming the high resistance region 22, being the region excluding the low resistance region 21 of the plasma generation electrode 15, a composite conductive material is used ideally, for example an aluminum nitride and tungsten composite conductive ceramic, an aluminum nitride and molybdenum composite conductive ceramic, an aluminum nitride and tantalum carbide composite conductive ceramic, or the like.

The thickness of this high resistance region 22 is not limited specifically. However, it is normally within a range of 15 $\mu$m to 150 $\mu$m, and is preferably the same as the thickness of the adjacent low resistance region 21.

Figure 4A:
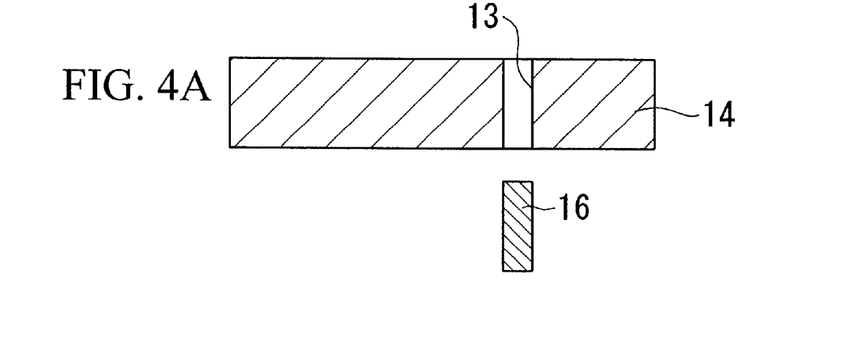
FIGS. 4A, 4B, and 4C are process diagrams showing a manufacturing method for the susceptor with a built-in plasma generation electrode of the first embodiment of the present invention.
Figure 4B:
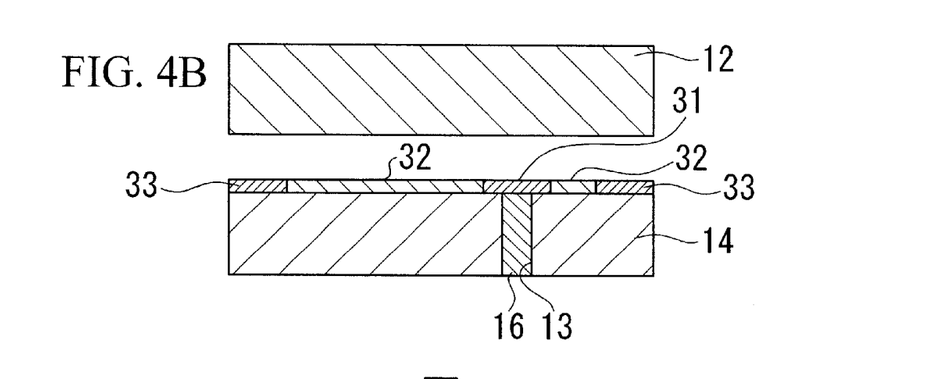
Figure 4C:
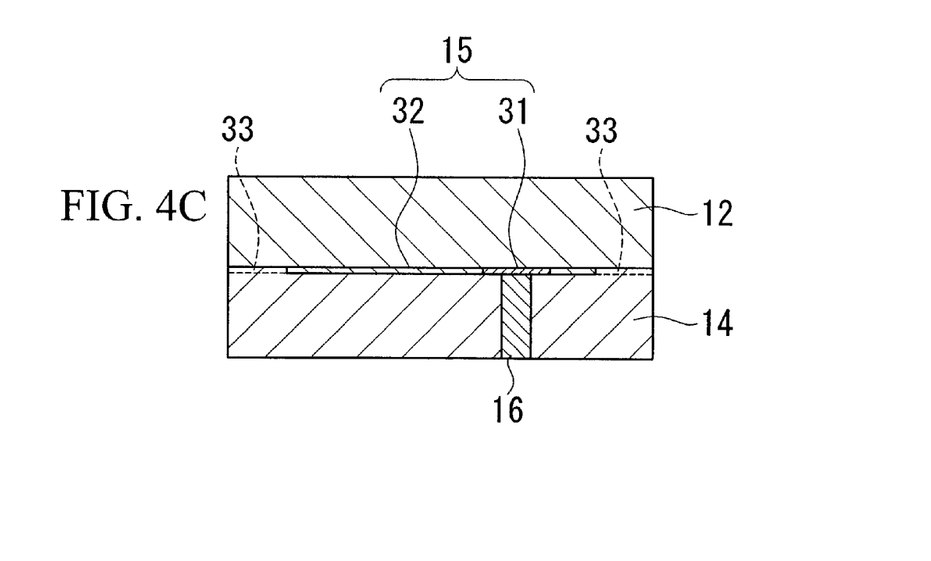

Next is a description of a method of manufacturing a susceptor with a built-in plasma generation electrode of the present embodiment based on FIG. 4.

Firstly, a flat mounting plate 12 and a support plate 14 are manufactured using an alumina based ceramic, an aluminum nitride based ceramic, or the like.

Next, as shown in FIG. 4(a), a preparatory fixing hole 13 for receiving and holding the power supply terminal 16 is formed in the support plate 14 There is no particular limitation on the method used to form this fixing hole 13, and it can be formed using, for example, drilling using a diamond drill, laser processing, electrodischarge machining, or ultrasonic machining. Moreover, the accuracy of this processing may be normal machining accuracy, and the processing can be performed with a yield approaching 100%.

The location and the number of the fixing hole 13 are determined according to the form and shape of the plasma generation electrode 15.

Next, the power supply terminal 16 is manufactured to such a size and shape that can fit tightly and be fixed into the fixing hole 13 in the support plate 23.

The method for manufacturing this power supply terminal 16 differs depending on whether the principal material is a composite conductive ceramic or a metal.

In the case of a composite conductive ceramic, there is a method in which a conductive ceramic powder is formed into the desired shape and then undergoes pressure calcination to make a sintered body. At this time, the conductive ceramic powder used as the power supply terminal 16 is preferably a ceramic powder having the same composition as the plasma generation electrode 15.

In the case of a metal, manufacturing is performed by a known metal processing method such as grinding or powder metallurgy, using a high melting point metal such as tungsten or molybdenum.

Since this power supply terminal 16 is recalcinated in a subsequent pressure and heat treatment, and fitted tightly and fixed into the fixing hole 13 of the support plate 14, the processing accuracy may have a clearance within the standard Japan Industrial Standard (JIS) tolerance level.

Next, this power supply terminal 16 is fitted into the fixing hole 13 of the support plate 14.

As shown in FIG. 4(b), a low resistance region plasma generation electrode forming coating agent (first electrode coating material) formed from a low resistance conductive material dissolved in an organic solvent such as terpineol is coated onto a predetermined region on the surface of the support plate 14 where the power supply terminal 16 is fitted, so as to make contact with the power supply terminal 16, and then dried, thereby forming a low resistance region plasma generation electrode forming layer (first plasma generation electrode forming layer) 31.

Then, a high resistance region plasma generation electrode forming coating agent (second electrode coating material) formed from a conductive material with higher resistance than the low resistance conductive material dissolved in an organic solvent such as terpineol is coated onto the support plate 14, so as to make contact with the low resistance region plasma generation electrode forming layer 31, and then dried, thereby forming a high resistance region plasma generation electrode forming layer (second electrode coating material) 32. For a coating method of such coating agents, since coating is required with an even thickness, it is desirable to use screen printing or the like.

Next, in those regions on the support plate 23 other than the regions where the low resistance region plasma generation electrode forming layer 31 and the high resistance region plasma generation electrode forming layer 32 are formed, an insulation material layer 33 containing a powdered material that has the same composition as, or which shares a principal ingredient with, the material that forms the mounting plate 22 and the support plate 23 is formed in order to improve insulation, corrosion resistance and plasma resistance.

As an example of a formation method for this insulation material layer 33, there is a method in which a coating agent consisting of aluminum powder or aluminum nitride powder dissolved in an organic solvent such as ethyl alcohol is coated by screen printing onto predetermined locations on the support plate 23, and then dried.

Next, as shown in FIG. 4(*c*), after superposing the mounting plate 12 on the support plate 14, upon which are formed the low resistance region plasma generation electrode forming layer 31, the high resistance region plasma generation electrode forming layer 32, and the insulation material layer 33, the resulting product is heat treated under pressure.

For the heat treatment conditions at this time, it is preferable that the atmosphere is a vacuum or an inert gas atmosphere of Ar, He, $N_2$ or the like. The pressure is preferably 0.5 MPa to 40 MPa. Furthermore, the heat treatment temperature is preferably 1500° C. to 1850° C., and the heat treatment time is preferably 0.5 hour or more.

By this heat treatment under pressure, the low resistance region plasma generation electrode forming layer 31 formed on the support plate 14 is calcinated to become a low resistance region 21 formed from a composite conductive ceramic, the high resistance region plasma generation electrode forming layer 32 is calcinated to become a high resistance region 22 formed from a composite conductive ceramic, and the insulation material layer 33 is calcinated to become an insulating layer 17 formed from an insulating ceramic.

In this manner, it is possible to obtain a susceptor with a built-in plasma generation electrode 11 in which abnormal heat generation in the high current density region in the vicinity of the connection to the power supply terminal 16, in other words the low resistance region 21, is suppressed.

Furthermore, the mounting plate 12 and the support plate 14 are joined and unified via the insulating layer 17 by only heat treatment under pressure, with no intervention of an organic bonding agent or a metallic bonding agent between them. Moreover, the power supply terminal 16 is recalcinated by heat treatment under pressure, and fitted tightly and fixed into the fixing hole 13 of the support plate 14.

Here is a further detailed description of the method of forming the low resistance region 21 of the plasma generation electrode 15 as described above.

(1) A Case Where the Ceramic Constituting the Mounting Plate 12 and the Support Plate 14 is an Alumina Based Ceramic.

The low resistance region plasma generation electrode forming layer 31 is preferably formed by any one of the following methods 1 through 4.

1. A first electrode forming layer is formed on the support plate 14 using a coating agent containing an alumina and tantalum carbide composite conductive material, then a second electrode forming layer is formed on the first electrode forming layer using a coating agent containing tantalum carbide, and further a third electrode forming layer is formed on the second electrode forming layer using a coating agent containing an alumina and tantalum carbide composite conductive material.

2. A first electrode forming layer is formed on the support plate 14 using a coating agent containing an alumina and tantalum carbide composite conductive material, then a second electrode forming layer is formed on the first electrode forming layer using a coating agent containing tantalum, and further a third electrode forming layer is formed on the second electrode forming layer using a coating agent containing an alumina and tantalum carbide composite conductive material.

3. A first electrode forming layer is formed on the support plate 14 using a coating agent containing an alumina and molybdenum carbide composite conductive material, then a second electrode forming layer is formed on the first electrode forming layer using a coating agent containing molybdenum carbide, and further a third electrode forming layer is formed on the second electrode forming layer using a coating agent containing an alumina and molybdenum carbide composite conductive material.

4. A first electrode forming layer is formed on the support plate 14 using a coating agent containing an alumina and tungsten composite conductive material, then a second electrode forming layer is formed on the first electrode forming layer using a coating agent containing tungsten, and further a third electrode forming layer is formed on the second electrode forming layer using a coating agent containing an alumina and tungsten composite conductive material.

By heat treating the low resistance region plasma generation electrode forming layer 31 formed by any one of the methods under pressure, it is possible to obtain a low resistance region 21 with a three layer structure.

As a result, it is possible to manufacture an alumina system susceptor with a built-in plasma generation electrode 11 that enables low resistance in the high current density region in the vicinity of the connection of the plasma generation electrode 15 and the power supply terminal 16 to be achieved easily, enables the difference between the coefficients of thermal expansion of the mounting plate 12 or the support plate 14 and the plasma generation electrode 15 to be less than $2 \times 10^{-6}$/° C., enables the thermal stress caused by the difference in coefficients of thermal expansion to be reduced easily, and enables an improvement in durability.

(2) A Case where the Ceramic Constituting the Mounting Plate 12 and the Support Plate 14 is an Aluminum Nitride Based Ceramic.

The low resistance region plasma generation electrode forming layer 31 is preferably formed by one of the following methods 1 or 2.

1. A first electrode forming layer is formed on the support plate 14 using a coating agent containing an aluminum nitride and tungsten composite conductive material, then a second electrode forming layer is formed on the first electrode forming layer using a coating agent containing tungsten, and further a third electrode forming layer is formed on the second electrode forming layer using a coating agent containing an aluminum nitride and tungsten composite conductive material.
2. A first electrode forming layer is formed on the support plate 14 using a coating agent containing an aluminum nitride and molybdenum composite conductive material, then a second electrode forming layer is formed on the first electrode forming layer using a coating agent containing molybdenum, and further a third electrode forming layer is formed on the second electrode forming layer using a coating agent containing an aluminum nitride and molybdenum composite conductive material.

By heat treating the low resistance region plasma generation electrode forming layer 31 formed by any one of the methods under pressure, it is possible to obtain a low resistance region 21 with a three layer structure.

As a result, it is possible to manufacture an aluminum nitride system susceptor with a built-in plasma generation electrode 11 that enables low resistance in the high current density region in the vicinity of the connection of the plasma generation electrode 15 and the power supply terminal 16 to be achieved easily, enables the difference between the coefficients of thermal expansion of the mounting plate 12 or the support plate 14 and the plasma generation electrode 15 to be less than $2 \times 10^{-6}/°$ C., enables the thermal stress caused by the difference in coefficients of thermal expansion to be reduced easily, and enables an improvement in durability.

As described above, according to the susceptor with a built-in plasma generation electrode 11 of the present embodiment, since the region in the vicinity of the connection of the plasma generation electrode 15 to the power supply terminal 16 is made into a low resistance region 21, and the other region is made into a high resistance region 22, it is possible to suppress abnormal heat generation in the region in the vicinity of the connection (low resistance region 21), so that the heat of the mounting plate 12 and the support plate 14 can be made uniform. Accordingly, it is possible to improve the heat uniformity of the mounting surface 12a on the mounting plate 12, and as a result it is possible to improve the heat uniformity of a plate specimen such as a silicon wafer or the like mounted onto the mounting surface 12a, thus enabling the throughput by plasma processing of the plate specimen to be made uniform. Furthermore, durability can be improved significantly as a result of the improvement in heat uniformity of the mounting surface 12a of the mounting plate 12.

Moreover, since the joining surfaces of the mounting plate 12 and the support plate 14 are joined and unified by an insulating layer 17 formed from an insulating material that has the same composition or has the same principal ingredient as the material constituting them, there is no concern about gas, plasma or the like penetrating the inside of the susceptor with a built-in plasma generation electrode 11 from the interface of the mounting plate 21 and the support plate 23, and the plasma generation electrode 15 is thus not exposed to these. Consequently, there is no concern about the interface of the mounting plate 12 and the support plate 14 being damaged. Furthermore, since for the built-in plasma generation electrode 15, there is no concern about abnormal electrical discharge or damage or the like occurring, the corrosion resistance and plasma resistance of this susceptor with a built-in plasma generation electrode 11 can be improved.

In the susceptor with a built-in plasma generation electrode of the present embodiment, a low resistance region plasma generation electrode forming layer 31, a high resistance region plasma generation electrode 32, and an insulation material 33 are formed on the interface of the support plate 14 and the mounting plate 12, which have been made into a sintered body, and are then heat treated under pressure, and joined and unified. Hence abnormal heat generation in the low resistance region 21 is suppressed, thus enabling an improvement in heat uniformity of the mounting surface 12a of the mounting plate 12. As a result it is possible to improve the heat uniformity of a plate specimen such as a silicon wafer or the like mounted onto the mounting surfaced 12a, the throughput by plasma processing of the plate specimen can be made uniform, and it is possible to manufacture a susceptor with a built-in plasma generation electrode whose durability can be improved significantly, economically and with a high yield.

Second Embodiment

Figure 5:
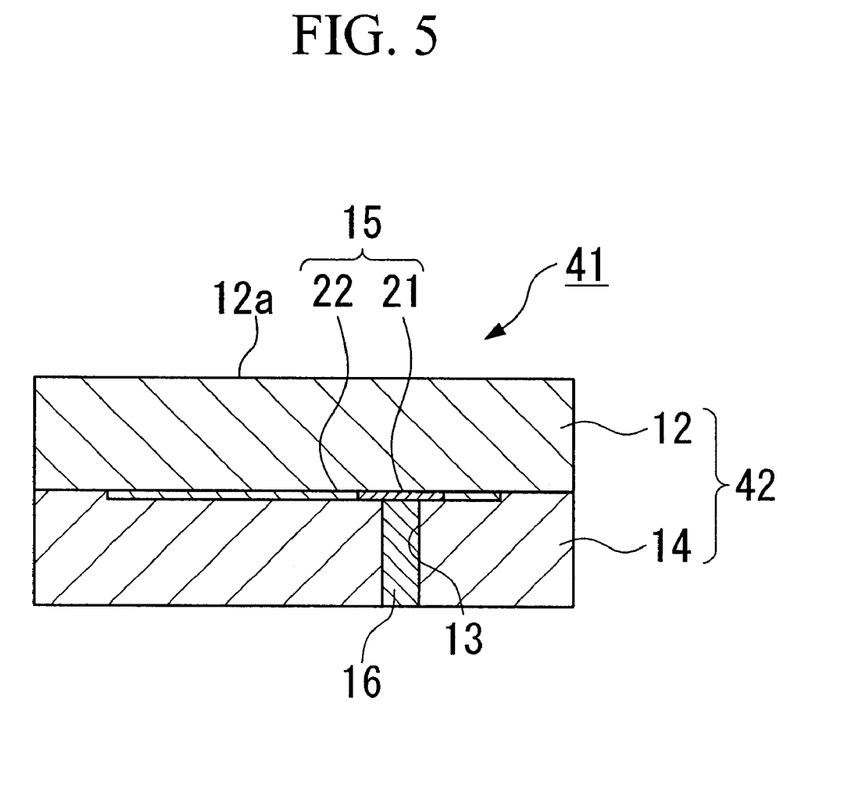
FIG. 5 is a longitudinal sectional view showing a susceptor with a built-in plasma generation electrode of a second embodiment of the present invention.

FIG. 5 is a longitudinal sectional view showing a susceptor with a built-in plasma generation electrode of a second embodiment of the present invention. The point of difference between this susceptor with a built-in plasma generation electrode 41 and the susceptor of the first embodiment is that in the susceptor 11 of the first embodiment, the mounting plate 12 and the support plate 14 are joined and unified by an insulating layer 17 formed from an insulating material that has the same composition or has the same principal ingredient. On the other hand, in the susceptor 41 of the present embodiment, by manufacturing a mounting plate green body, a support plate green body and a power supply terminal green body (power supply terminal forming material) from a slurry containing a ceramic powder, and by heat treating them under pressure, the mounting plate 12 and the support plate 14 are directly joined and unified to make the susceptor substrate 42 with no intervening insulating layer 17.

Figure 6A:
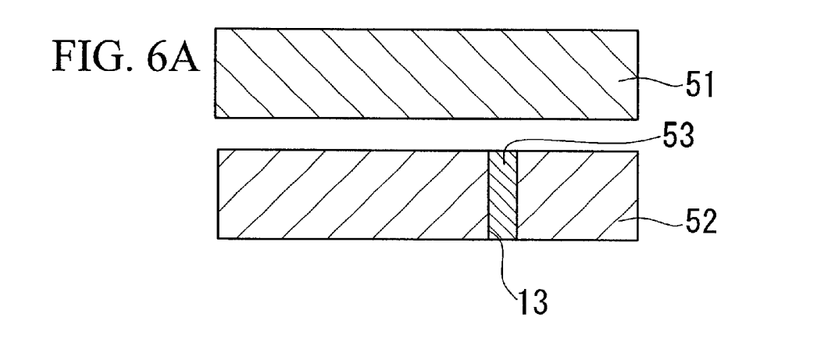
FIGS. 6A, 6B, and 6C are process diagrams showing a manufacturing method for the susceptor with a built-in plasma generation electrode of the second embodiment of the present invention.
Figure 6B:
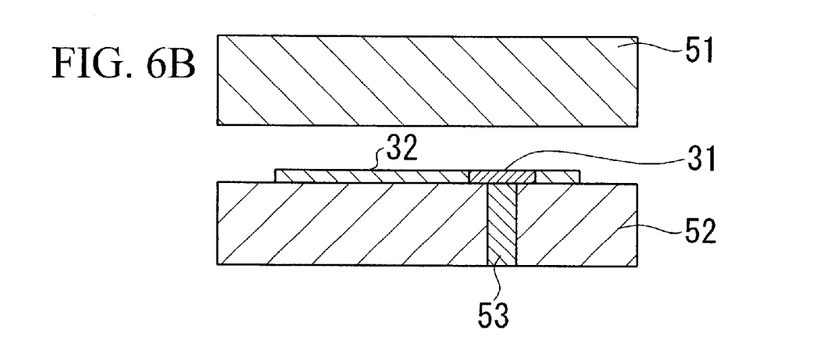
Figure 6C:
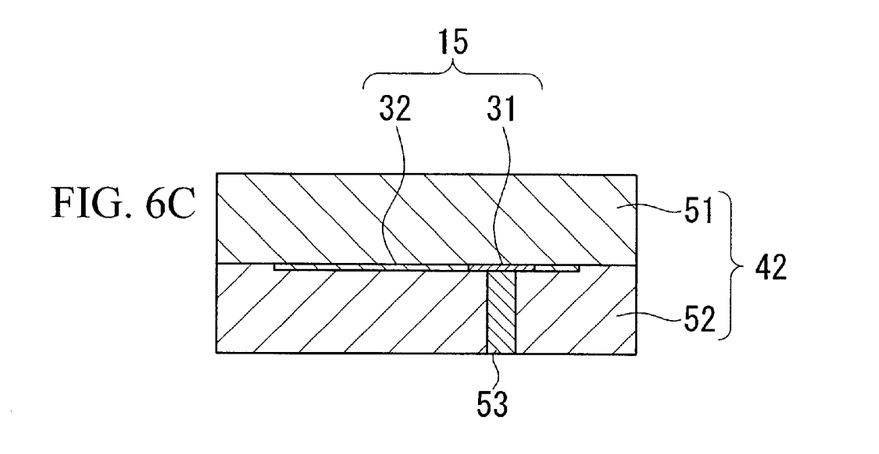

Next is a description of a manufacturing method for a susceptor with a built-in plasma generation electrode of the present embodiment based on FIG. 6. Here, the same reference symbols are used for the same structural elements as in FIG. 4, and the descriptions are omitted.

Firstly, as shown in FIG. 6(a), by using a doctor blade method, or the like for example, a mounting plate green body 51 and a support plate green body 52 are manufactured from a slurry containing a ceramic powder such as an alumina based ceramic powder, an aluminum nitride based ceramic powder, or the like.

Next, a fixing hole 13 is formed in this support plate green body 52, that passes through in the thickness direction, and this fixing hole 13 is filled with a power supply terminal green body 53 containing conductive powder. Instead of filling with this power supply terminal green body 53, a power supply terminal 16, being a sintered compact, may be fitted.

Next, as shown in FIG. 6(b), a predetermined region on the surface of the support plate green body 52 is coated with a low resistance region plasma generation electrode forming coating agent so as to make contact with the power supply terminal green body 53, and then dried, thereby forming a low resistance region plasma generation electrode forming layer 31.

Then, the support plate green body 52 is coated with a high resistance region plasma generation electrode forming coating agent, so as to make contact with the low resistance region plasma generation electrode forming layer 31, and then dried, thereby forming a high resistance region plasma generation electrode forming layer 32.

Next, as shown in FIG. 6(c), after superposing the mounting plate green body 51 on the support plate green body 52, upon which are formed the low resistance region plasma generation electrode forming layer 31 and the high resistance region plasma generation electrode forming layer 32, the resulting product is heat treated under pressure.

For the heat treatment conditions at this time, it is preferable that the atmosphere is a vacuum or an inert gas atmosphere of Ar, He, $N_2$ or the like. The pressure is preferably 0.5 to 40 MPa. Furthermore, the heat treatment temperature is preferably 1500° C. to 1850° C., and the heat treatment time is preferably 0.5 hour or more.

By this heat treatment under pressure, the mounting plate green body 51, the support plate green body 52, the power supply terminal green body 53, the low resistance region plasma generation electrode forming layer 31, and the high resistance region plasma generation electrode forming layer 32 are calcinated, and at the same time joined and unified, so that it is possible to obtain a susceptor with a built-in plasma generation electrode 41 in which the mounting plate 12 and the support plate 14 are directly joined and unified.

According to the susceptor with a built-in plasma generation electrode 41 of the present embodiment, the mounting plate green body 51, the support plate green body 52, the power supply terminal green body 53, the low resistance region plasma generation electrode forming layer 31, and the high resistance region plasma generation electrode forming layer 32 are calcinated, and at the same time joined and unified. Therefore it is possible to increase the mechanical integrity of the joint of the mounting plate 12 and the support plate 14 and make this uniform, so that it is possible to make the heat of the mounting plate 12 and the support plate 14 uniform, thus enabling an improvement in the heat uniformity of a plate specimen such as a silicon wafer or the like mounted onto the mounting surface 12a. As a result it is possible to make the throughput by plasma processing of the plate specimen uniform. Furthermore, as a result of the improvement in heat uniformity of the mounting surface 12a of the mounting plate 12, durability can be improved significantly.

According to the manufacturing method for a susceptor with a built-in plasma generation electrode 41 of the present embodiment, since the mounting plate green body 51, the support plate green body 52, the power supply terminal green body 53, the low resistance region plasma generation electrode forming layer 31, and the high resistance region plasma generation electrode forming layer 32 are heat treated under pressure, and are joined and unified, abnormal heat generation in the low resistance region 21 is suppressed, thus enabling an improvement in the heat uniformity of the mounting surface 12a of the mounting plate 12. As a result, it is possible to improve the heat uniformity of a plate specimen such as a silicon wafer or the like mounted onto the mounting surface 12a, and the throughput by plasma processing of the plate specimen can be made uniform, so that it is possible to manufacture a susceptor with a built-in plasma generation electrode whose durability can be improved significantly, by one heat treatment, economically and with a high yield.

EXAMPLES

The present invention is described in further detail below through examples and comparative examples.

Example 1

Manufacturing the Power Supply Terminal 40 parts by volume of alumina powder (average particle diameter 0.2 $\mu$m), 60 parts by volume of tantalum carbide powder (average particle diameter 1 $\mu$m), and 100 parts by volume of isopropyl alcohol were mixed together, and then evenly dispersed using a planetary ball mill, thereby obtaining a slurry.

Afterwards, the alcohol portion of this slurry was removed by suction filtration, the remaining solid portion was dried, and an alumina and tantalum carbide composite powder was obtained.

Next, this composite powder was molded and calcinated, thereby obtaining a cylinder shaped alumina and tantalum carbide composite conductive ceramic with a diameter of 5 mm and a length of 5 mm to serve as a power supply terminal 16. The calcination was pressurized calcination using a hot press, with the pressurized calcination conditions being a calcination temperature of 1700° C. and a pressure of 20 MPa.

The relative density of the alumina and tantalum carbide composite conductive ceramic after calcination was 98% or higher.

Manufacturing the Support Plate

Alumina powder (average particle diameter 0.2 $\mu$m) was molded and calcinated, thereby obtaining a disc shaped alumina ceramic (support plate 14) with a diameter of 230 mm and a thickness of 5 mm. The calcination was pressurized calcination using a hot press, and the calcination conditions were the same as those for the power supply terminal 16.

Next, a fixing hole 13 for receiving and securing the power supply terminal 16 was formed in the alumina ceramic by drilling using a diamond drill, thereby obtaining a support plate 14 formed from an alumina ceramic.

Manufacturing the Mounting Plate

In the same manner as in the above-described manufacturing method for the support plate 14, a disc shaped alumina ceramic with a diameter of 230 mm and a thickness of 5 mm was obtained. Next, one primary surface of this disc shaped alumina ceramic was polished to obtain a flatness of 10 $\mu$m, thereby obtaining a mounting plate 12 formed from an alumina ceramic with this polished face as the mounting surface of a plate specimen such as a silicon wafer or the like.

Forming the Plasma Generation Electrode Forming Layer etc.

The above-described power supply terminal 16 was pressed into the fixing hole 13 formed in the support plate 23, and thereby embedded and fixed.

Then, as shown in FIG. 2 and FIG. 4, a low resistance region plasma generation electrode forming layer 31 with a three layer structure was formed in a circular region of radius 20 mm from the central axis of the power supply terminal 16 on the support plate 14 into which this power supply terminal 16 had been embedded and fixed, in a location that was to be made into a low resistance region plasma generation electrode 21 by later heat treatment processing under pressure.

This low resistance region plasma generation electrode forming layer 31 with a three layer structure was formed as follows.

Firstly, the support plate was coated with a coating agent comprising a composite conductive material (alumina powder (average particle diameter 0.2 μm) 70 v/v %, tantalum carbide powder 30 v/v %) and terpineol or the like using a screen printing method, and then dried, thereby forming a first electrode forming layer.

Next, this electrode forming layer was coated with a coating agent comprising conductive material (tantalum carbide powder) and terpineol or the like using a screen printing method, and then dried, thereby forming a second electrode forming layer.

Then, this second electrode forming layer was coated with the same coating agent as the first electrode forming layer using a screen printing method, and then dried, thereby forming a third electrode forming layer.

Next, the region on the support plate in a circular region of radius 20 mm from the center of the support plate 14, excluding the low resistance region plasma generation electrode forming layer 31 with a three layer structure, was coated with a composite conductive material (alumina powder (average particle diameter 0.2 μm) 70 v/v %, tantalum carbide powder 30 v/v %) and terpineol or the like using a screen printing method, and then dried, thereby forming a high resistance region plasma generation electrode forming layer 32.

Then, the region on the support plate 14 excluding the low resistance region plasma generation electrode forming layer 31 and the high resistance region plasma generation electrode forming layer 32 was coated with an insulating layer forming coating agent comprising alumina powder (average particle diameter 0.2 μm) 70 weight %, and the remainder terpineol, using a screen printing method, and then dried, thereby forming an insulation material layer 33.

Joining and Unification

Next, as shown in FIG. 4(*c*), the mounting plate 12 and the support plate 14 were superposed so as to enclose the low resistance region plasma generation electrode forming layer 31, the high resistance region plasma generation electrode forming layer 32, and the insulation material 33, and such that the polished surface of the mounting plate 12 was the upper surface, and then pressurized and heat treated in a hot press to join and unify them. The atmosphere during the pressurizing and heat treatment at this time was an argon (Ar) atmosphere, the pressure was 7.5 MPa, the heat treatment temperature was 1750° C., and the heat treatment time was 2 hours.

Subsequently, the temperature was brought to room temperature by radiational cooling, thus obtaining a susceptor with a built-in plasma generation electrode of example 1. In this susceptor, the thickness of the second electrode layer was 15 μm, the thickness of the third electrode layer was 10 μm, and the thickness of the high resistance region plasma generation electrode layer 22 was 35 μm.

Example 2

In example 2, a susceptor with a built-in plasma generation electrode was obtained in the same manner as example 1. However, the compositions of the coating materials constituting the low resistance region plasma generation electrode forming layer 31 were changed partially as follows.

First electrode forming layer: same as in example 1.

Second electrode forming layer: coating agent comprising conductive material (tantalum powder (average particle diameter 0.2 μm)) and terpineol or the like.

Third electrode forming layer: same as the first electrode forming layer.

Example 3

In example 3, a susceptor with a built-in plasma generation electrode was obtained in the same manner as example 1. However, the compositions of the coating materials constituting the low resistance region plasma generation electrode forming layer 31 were changed as follows.

First electrode forming layer: coating agent comprising composite conductive material (alumina powder (average particle diameter 0.2 μm) 50 v/v %, molybdenum carbide powder (average particle diameter 0.5 μm) 50 v/v %) and terpineol or the like.

Second electrode forming layer: coating agent comprising conductive material (molybdenum carbide powder (average particle diameter 0.5 μm)) and terpineol or the like.

Third electrode forming layer: same as the first electrode forming layer.

Example 4

In example 4, a susceptor with a built-in plasma generation electrode was obtained in the same manner as example 1. However, the compositions of the coating materials constituting the low resistance region plasma generation electrode forming layer 31 were changed as follows.

First electrode forming layer: coating agent comprising composite conductive material (alumina powder (average particle diameter 0.2 μm) 65 v/v %, tungsten powder (average particle diameter 1 μm) 35 v/v %) and terpineol or the like.

Second electrode forming layer: coating agent comprising conductive material (tungsten powder (average particle diameter 1 μm)) and terpineol or the like.

Third electrode forming layer: same as the first electrode forming layer.

Example 5

Manufacturing the Power Supply Terminal 70 parts by volume of aluminum nitride powder (average particle diameter 0.5 μm, containing 5 wt % of a sintering additive $Y_2O_3$), 30 parts by volume of tungsten powder (average particle diameter 1 μm), and 150 parts by volume of terpineol were mixed together, and then evenly dispersed using a planetary ball mill, thereby obtaining a slurry.

Afterwards, the alcohol portion of this slurry was removed by suction filtration, the remaining solid portion was dried, and a mixture of aluminum nitride and tungsten powder was obtained.

Next, this composite powder was molded and calcinated, thereby obtaining a cylinder shaped aluminum nitride and tungsten composite conductive ceramic with a diameter of 5 mm and a length of 5 mm to serve as a power supply terminal 16. The calcination was pressurized calcination using a hot press, with the pressurized calcination conditions being a calcination temperature of 1700° C. and a pressure of 20 MPa.

The relative density of the aluminum nitride and tungsten composite conductive ceramic after calcination was 98% or higher.

Manufacturing the Support Plate

Aluminum nitride powder (average particle diameter 0.5 μm, containing 5 wt % of a sintering additive $Y_2O_3$. Abbreviated hereunder as simply aluminum nitride powder) was molded and calcinated, thereby obtaining a disc shaped aluminum nitride ceramic (support plate 14) with a diameter of 230 mm and a thickness of 5 mm. The pressurized calcination conditions were exactly the same as those for the power supply terminal 16.

Next, a fixing hole 13 for receiving and securing the power supply terminal 16 was formed in the aluminum nitride ceramic by drilling using a diamond drill or the like, thereby obtaining a support plate 14 formed from an aluminum nitride ceramic.

Manufacturing the Mounting Plate

A disc shaped aluminum nitride ceramic with a diameter of 230 mm and a thickness of 5 mm was obtained in the same manner as in the above-described manufacturing method for the support plate 14. Next, the primary surface (the mounting surface of the plate specimen) of this disc shaped aluminum nitride ceramic was polished to obtain a flatness of 10 $\mu$m, thereby obtaining a mounting plate 12 formed from an aluminum nitride ceramic.

Forming the Plasma Generation Electrode Forming Layer etc.

The above-described power supply terminal 16 was pressed into the fixing hole 13 formed in the support plate 23, and thereby embedded and fixed.

Then, in the same manner as example 1, a low resistance region plasma generation electrode forming layer 31 was formed on the support plate 14, so as to make contact with the power supply terminal 16.

However, the compositions of the coating materials constituting the low resistance region plasma generation electrode forming layer 31 were changed as follows.

First electrode forming layer: coating agent comprising composite conductive material (aluminum nitride powder 70 v/v %, tungsten powder (average particle diameter 1 $\mu$m) 30 v/v %) and terpineol or the like.

Second electrode forming layer: coating agent comprising conductive material (tungsten powder (average particle diameter 1 $\mu$m)) and terpineol or the like.

Third electrode forming layer: same as the first electrode forming layer.

Furthermore, the support plate 14 was coated with a coating agent comprising a composite conductive material (aluminum nitride powder 70 v/v %, tungsten powder (average particle diameter 0.2 $\mu$m) 30 v/v %) and terpineol or the like using a screen printing method, so as to make contact with the low resistance region plasma generation electrode forming layer 31, and then dried, thereby forming a high resistance region plasma generation electrode forming layer 32.

Then, the region on the support plate 14 excluding the low resistance region plasma generation electrode forming layer 31 and the high resistance region plasma generation electrode forming layer 32 was coated with an insulating layer forming coating agent comprising aluminum nitride powder 70 weight %, with the remainder comprising terpineol or the like, using a screen printing method, and then dried, thereby forming an insulation material layer 33.

Joining and Unification

Next, as shown in FIG. 4(*c*), the support plate 14 and the mounting plate 12 were superposed so as to enclose the low resistance region plasma generation electrode forming layer 31, the high resistance region plasma generation electrode forming layer 32, and the insulation material 33, and such that the polished surface of the mounting plate 12 was the upper surface, and then pressurized and heat treated in a hot press to join and unify them. The atmosphere during the pressurizing and heat treatment at this time was an argon (Ar) atmosphere, the pressure was 7.5 MPa, the heat treatment temperature was 1750° C., and the heat treatment time was 2 hours.

Subsequently, the temperature was brought to room temperature by radiational cooling, thus obtaining the susceptor with a built-in plasma generation electrode of example 5. In this susceptor, the thickness of the second electrode layer was 15 $\mu$m, the thickness of the third electrode layer was 10 $\mu$m, and the thickness of the high resistance region plasma generation electrode layer 22 was 35 $\mu$m.

Example 6

In example 6, a susceptor with a built-in plasma generation electrode was obtained in the same manner as example 5. However, the compositions of the coating materials constituting the low resistance region plasma generation electrode forming layer 31 were changed as follows.

First electrode forming layer: coating agent comprising composite conductive material (aluminum nitride powder 70 v/v %, molybdenum powder (average particle diameter 1 $\mu$m) 30 v/v %) and terpineol or the like.

Second electrode forming layer: coating agent comprising conductive material (molybdenum powder (average particle diameter 1 $\mu$m)) and ethyl alcohol or the like.

Third electrode forming layer: same as the first electrode forming layer.

Example 7

Green bodies forming a power supply terminal, a mounting plate and a support plate, after calcination, were manufactured using conventional techniques in the same manner as in example 1. The power supply terminal green body was embedded and fixed into a fixing hole formed in the support plate green body. Next, in the same manner as in example 1, these green bodies were stacked, pressurized and heat treated in a hot press, thereby joining and unifying them. The atmosphere, pressure conditions and heat treatment conditions in this pressure and heat treatment were exactly the same as in example 1.

Subsequently, the temperature was brought to room temperature by radiational cooling, thus obtaining the susceptor with a built-in plasma generation electrode of example 7.

Comparative Example 1

In comparative example 1, a susceptor with a built-in plasma generation electrode was obtained in the same manner as in example 1.

However, the plasma generation electrode 15 was formed by a coating agent used when forming the high resistance region plasma generation electrode forming layer 32 in example 1, so there was no low resistance region plasma generation electrode 21. Therefore, the high current density region in the vicinity of the joint to the power supply terminal 16 was not low resistance.

Comparative Example 2

In comparative example 2, a susceptor with a built-in plasma generation electrode was obtained in the same manner as in example 5.

However, the plasma generation electrode 15 was formed by a coating agent used when forming the high resistance region plasma generation electrode forming layer 32 in example 5, so there was no low resistance region plasma generation electrode 21. Therefore, the high current density region in the vicinity of the joint to the power supply terminal 16 was not low resistance.

Evaluation

The following evaluations were performed on the susceptors with built-in plasma generation electrodes of examples 1 to 7 and comparative examples 1 and 2 manufactured in the above manner.

(1) Examination of the Cross-section of the Joint by Scanning Electron Microscope (SEM)

The cross-sections of the joints in the susceptors with built-in plasma generation electrodes of examples 1 to 7 and comparative examples 1 and 2 were examined using an SEM, and it was confirmed that the mounting plates 12, the support plates 14 and the power supply terminals 16 were joined and unified satisfactorily.

(2) Evaluation of Corrosion Resistance and Plasma Resistance

Each of the susceptors with built-in plasma generation electrodes of examples 1 to 7 and comparative examples 1 and 2 was placed in a mixed gas (1 torr) of $CF_4$ gas and $O_2$ gas, high frequency current (13.57 MHz) was applied to the plasma generation electrode 15 through the power supply terminal 16 of the susceptor to generate plasma, and after exposing the susceptor to this plasma for 15 hours the surface characteristics of the susceptor were visually inspected, with no change in the surface characteristics observed.

Furthermore, the change in the surface roughness of the mounting surface 12a of the susceptor was measured before and after exposure in the plasma, and the surface roughness Ra before the experiment was 0.12 $\mu$m, and Ra after the experiment was 0.13 $\mu$m, which shows that the surface roughness had barely changed also.

From the above, it was determined that the corrosion resistance and plasma resistance were very good in examples 1 to 7 and comparative examples 1 and 2.

(3) Result of Plasma Exposure Cycling Test

When the susceptors with built-in plasma generation electrodes of examples 1 to 7 and comparative examples 1 and 2 were exposed in the above plasma for 15 hours 100 times repeatedly, no problem occurred in the susceptors with built-in plasma generation electrodes of examples 1 to 7. However, in the susceptors with built-in plasma generation electrodes of comparative examples 1 and 2, it was confirmed that cracks occurred in the vicinity of the connection of the plasma generation electrode 15 and the power supply terminal 16.

(4) Evaluation of Plasma Etching Processing

When Si wafers were mounted onto the susceptors with built-in plasma generation electrodes of examples 1 to 7 and plasma etching was applied to these Si wafers, the distribution of the etching rate was ±1%.

However, when plasma etching was performed using the susceptors with built-in plasma generation electrodes of comparative examples 1 and 2, similarly to examples 1 to 7, the distribution of the etching rate was ±3%.

The above evaluation shows that the susceptors with built-in plasma generation electrodes of examples 1 to 7 had excellent heat uniformity of the mounting surface 12a of the plate specimen compared with the susceptors with built-in plasma generation electrodes of comparative examples 1 and 2.

On the other hand, in the susceptors with built-in plasma generation electrodes of comparative examples 1 and 2, the region in the vicinity of the connection of the power supply terminal 16 and the plasma generation electrode 15 had a higher temperature than the other regions. It is thought that this is because the heat uniformity of the mounting surface 12a of the plate specimen is inferior.

As described above, according to the susceptor with a built-in plasma generation electrode of the present invention, since the region in the vicinity of the connection of the plasma generation electrode to the power supply terminal is made into a lower resistance region than the other regions of the plasma generation electrode, it is possible to suppress abnormal heat generation in the region in the vicinity of the connection of the plasma generation electrode to the power supply terminal, enabling heat uniformity of the susceptor substrate. Accordingly, it is possible to improve the heat uniformity of the mounting surface of the susceptor substrate, and as a result it is possible to improve the heat uniformity of a plate specimen mounted onto the mounting surface, so that the throughput by plasma processing of the plate specimen can be made uniform. Furthermore, as a result of the improvement in the heat uniformity of the mounting surface of the susceptor substrate, durability can be improved significantly.

Moreover, the throughput of deposition, etching or the like on a plate specimen which is processed using plasma, is made uniform, and there is no concern about cracks occurring in the vicinity of the connection of the plasma generation electrode and the power supply terminal.

Furthermore, since there is no corrosive gas or plasma penetrating the joint surface of the mounting plate and the support plate, there is no concern about the joint interface being damaged.

Moreover, since there is no corrosive gas or plasma penetrating the joint surface of the mounting plate and the support plate, there is no concern about the joint interface being damaged. Furthermore, since there is no concern about the plasma generation electrode being exposed to corrosive gas or plasma, corrosion resistance and plasma resistance are excellent.

According to the manufacturing method for a susceptor with a built-in plasma generation electrode of the present invention, a first plasma generation electrode forming layer is formed on one principal plane of a support plate, a second plasma generation electrode forming layer with high resistance is formed in the region on the principal plane of the support plate excluding the first plasma generation electrode forming layer, a mounting plate is superposed on this support plate via the first and second plasma generation electrode forming layers, and then heat treated under pressure. Consequently, abnormal heat generation in the region in the vicinity of the connection of the plasma generation electrode to the power supply terminal is suppressed, the heat uniformity of the mounting surface of the susceptor substrate is improved, and the throughput by plasma processing of a plate specimen mounted onto this mounting surface is made uniform. Moreover it is possible to manufacture a susceptor with a built-in plasma generation electrode whose durability is improved significantly, by one heat treatment, economically and with a high yield.

According to the other manufacturing method for a susceptor with a built-in plasma generation electrode of the present invention, a mounting plate green body and a support plate green body are manufactured, a first plasma generation electrode forming layer is formed on one principal plane of this support plate green body, a second plasma generation electrode forming layer with high resistance is formed in the region on the principal plane of this support plate green body excluding the first plasma generation electrode forming layer, and the mounting plate green body is superposed on this support plate green body via the first and second plasma generation electrode forming layers, and then heat treated. Consequently, abnormal heat generation in the region in the vicinity of the connection of the plasma generation electrode to the power supply terminal is suppressed, the heat uniformity of the mounting surface of the susceptor substrate is improved, and the throughput by plasma processing of a plate specimen mounted onto this mounting surface is made uniform. Moreover it is possible to manufacture a susceptor with a built-in plasma generation electrode whose durability is improved significantly, by one heat treatment, economically and with a high yield.

What is claimed is:

1. A susceptor with a built-in plasma generation electrode comprising: a susceptor substrate formed from a ceramic, one principal plane of which is a mounting surface on which a plate specimen is mounted; a plasma generation electrode built into this susceptor substrate; and a power supply terminal which is located so as to pass through said susceptor substrate and connected to said plasma generation electrode, wherein a region in the vicinity of the connection of said plasma generation electrode to said power supply terminal has a lower resistance than other regions of said plasma generation electrode.

2. A susceptor with a built-in plasma generation electrode according to claim 1, wherein said susceptor substrate comprises a mounting plate formed from a ceramic, one principal plane of which is a mounting surface on which a plate specimen is mounted, and a support plate formed from a ceramic, which is joined and integrated with said mounting plate.

3. A susceptor with a built-in plasma generation electrode according to claim 2, wherein an insulating layer that has at least the same principal ingredient as said support plate and said mounting plate, is formed in the regions on said support plate excluding said plasma generation electrode.

4. A susceptor with a built-in plasma generation electrode according to claim 1, wherein said ceramic is selected from a group consisting of aluminum oxide based ceramics and aluminum nitride based ceramics.

5. A susceptor with a built-in plasma generation electrode according to claim 1, wherein the low resistance region of said plasma generation electrode is of a multilayer structure comprising more than two layers containing conductive ceramic layers and/or composite conductive ceramic layers.

6. A susceptor with a built-in plasma generation electrode according to claim 5, wherein said multilayer structure is formed by sequentially laminating said composite conductive ceramic layer, said conductive ceramic layer or high melting point metal layer, and said composite conductive ceramic layer.

7. A susceptor with a built-in plasma generation electrode according to claim 6, wherein said composite conductive ceramic layer is formed by one ceramic material selected from a group consisting of an aluminum oxide and tantalum carbide composite conductive ceramic, an aluminum oxide and molybdenum carbide composite conductive ceramic, and an aluminum oxide and tungsten composite conductive ceramic, said conductive ceramic layer is formed by a tantalum carbide conductive ceramic or molybdenum carbide conductive ceramic, and said high melting point metal layer is formed by tantalum or tungsten.

8. A susceptor with a built-in plasma generation electrode according to claim 6, wherein;

said composite conductive ceramic layer is formed by an aluminum nitride and tungsten composite conductive ceramics or an aluminum nitride and molybdenum composite conductive ceramic, and said high melting metal layer is formed by tungsten or molybdenum.

9. A manufacturing method for a susceptor with a built-in plasma generation electrode comprising the steps of:

forming a mounting plate on which a plate specimen is mounted and a support plate that supports said mounting plate using ceramics;

then, forming an open hole in said support plate and inserting and fixing a power supply terminal into the open hole;

then, coating with a first electrode coating material containing conductive powder on one principal plane of said support plate so as to make contact with said power supply terminal to form a first plasma generation electrode forming layer;

then, coating with a second electrode coating material containing conductive powder with a higher resistance than said first electrode coating material in the regions on the principal plane of said support plate excluding said first plasma generation electrode forming layer, to form a second plasma generation electrode forming layer with a higher resistance than said first plasma generation electrode forming layer; and then, superposing said mounting plate onto said support plate via said first and second plasma generation electrode forming layers, heat treating under pressure to form a plasma generation electrode having a low resistance region and a high resistance region between said support plate and said mounting plate, and joining and unifying them.

10. A manufacturing method for a susceptor with a built-in plasma generation electrode comprising the steps of:

manufacturing a mounting plate green body on which a plate specimen is mounted and a support plate green body that supports said mounting plate using a slurry containing ceramic powder;

then, forming an open hole in said support plate green body, and packing power supply forming material containing conductive powder, or inserting a power supply terminal, into this open hole;

then, coating with a first electrode coating material containing conductive powder on one principal plane of said support plate green body so as to make contact with said power supply forming material or said power supply terminal to form a first plasma generation electrode forming layer;

then, coating with a second electrode coating material containing conductive powder with a higher resistance than said first electrode coating material in the regions on the principal plane of said support plate green body excluding said first plasma generation electrode forming layer, to form a second plasma generation electrode forming layer with a higher resistance than said first plasma generation electrode forming layer;

then, superposing said mounting plate green body onto said support plate green body via said first and second plasma generation electrode forming layers, and heat treating under pressure to form a plasma generation electrode having a low resistance region and a high resistance region between said support plate and said mounting plate, formed from ceramics, and joining and unifying them.

11. A manufacturing method for a susceptor with a built-in plasma generation electrode according to claim 9, wherein by forming an insulation material layer containing ceramic powder, which has at least the same principal ingredient as said support plate or said support plate green body, in the regions on one principal plane of said support plate or said support plate green body excluding said first and second plasma generation electrode forming layers, and then heat treating under pressure, said insulation material layer is made to be an insulating layer.

12. A manufacturing method for a susceptor with a built-in plasma generation electrode according to claim 9, wherein said ceramic is selected from the group consisting of aluminum oxide base ceramics and aluminum nitride base ceramics.

13. A manufacturing method for a susceptor with a built-in plasma generation electrode according to claim 9, wherein said first plasma generation electrode forming layer is made a three layer structure by forming a first layer using a composite conductive ceramic layer forming coating agent, forming a second layer using a conductive ceramic layer forming coating agent or a high melting point metal layer forming coating agent, and forming a third layer using a composite conductive ceramic layer forming coating agent.

14. A manufacturing method for a susceptor with a built-in plasma generation electrode according to claim 13, wherein
   said composite conductive ceramic layer forming coating agent contains one powder selected from an aluminum oxide and tantalum carbide composite conductive ceramic powder, an aluminum oxide and molybdenum carbide composite conductive ceramic powder, and an aluminum oxide and tungsten composite conductive ceramic powder,
   said conductive ceramic layer forming coating agent contains a tantalum carbide conductive ceramic powder or a molybdenum carbide conductive ceramic powder, and
   said high melting point metal layer forming coating agent contains tantalum powder or tungsten powder.

15. A manufacturing method for a susceptor with a built-in plasma generation electrode according to claim 13, wherein
   said composite conductive ceramic layer forming coating agent contains an aluminum nitride and tungsten composite conductive ceramic powder, or an aluminum nitride and molybdenum composite conductive ceramic powder, and
   said high melting point metal layer forming coating agent contains tungsten powder or molybdenum powder.

16. A manufacturing method for a susceptor with a built-in plasma generation electrode according to claim 10, wherein by forming an insulation material layer containing ceramic powder, which has at least the same principal ingredient as said support plate or said support plate green body, in the regions on one principal plane of said support plate or said support plate green body excluding said first and second plasma generation electrode forming layers, and then heat treating under pressure, said insulation material layer is made to be an insulating layer.

* * * * *